United States Patent [19]

Ishikawa

[11] Patent Number: 5,107,519
[45] Date of Patent: Apr. 21, 1992

[54] CODING DEVICE AND A DECODING DEVICE

[75] Inventor: Hisashi Ishikawa, Yokohama, Japan

[73] Assignee: Canon Kabushiki Kaisha, Tokyo, Japan

[21] Appl. No.: 429,056

[22] Filed: Oct. 30, 1989

[30] Foreign Application Priority Data

Nov. 17, 1988 [JP] Japan .................. 63-288861
Nov. 17, 1988 [JP] Japan .................. 63-288862
Nov. 17, 1988 [JP] Japan .................. 63-288863

[51] Int. Cl.$^5$ ........................... H04B 14/06
[52] U.S. Cl. ........................ 375/27; 358/135; 341/76
[58] Field of Search ............ 375/27, 28, 30; 358/133, 135; 381/29, 30; 341/76

[56] References Cited

U.S. PATENT DOCUMENTS

| | | | |
|---|---|---|---|
| 3,593,141 | 7/1971 | Brown | 375/27 |
| 4,200,886 | 4/1980 | Musmann et al. | 358/135 |
| 4,229,820 | 10/1980 | Enomoto | 375/27 |
| 4,292,651 | 9/1981 | Kretz et al. | 375/27 |
| 4,554,670 | 11/1985 | Aiko et al. | 358/135 |
| 4,743,967 | 5/1988 | Takenaka et al. | 358/136 |
| 4,791,483 | 12/1988 | Miller | 375/27 |
| 4,979,187 | 12/1990 | Aoki et al. | 375/27 |
| 4,995,059 | 2/1991 | Ishikawa | 375/27 |
| 5,043,728 | 8/1991 | Hoshi et al. | 341/106 |

Primary Examiner—Stephen Chin
Attorney, Agent, or Firm—Fitzpatrick, Cella Harper & Scinto

[57] ABSTRACT

A coding device comprises a coding circuit in which a range of values, which local decoded values are permitted to have is made narrower than a range of values, which input sample values are permitted to have when coding a differential value between an input sample value and its predictive value. A decoding device substitutes a decoded value to be subsequently decoded for a decoded value in which a gradient overload is produced when decoding a code provided by coding a differential value between an input sample value and its predictive value.

32 Claims, 9 Drawing Sheets

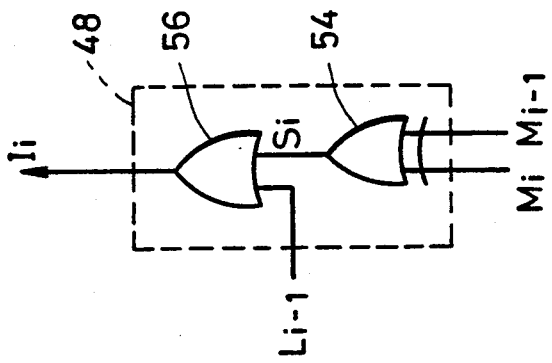
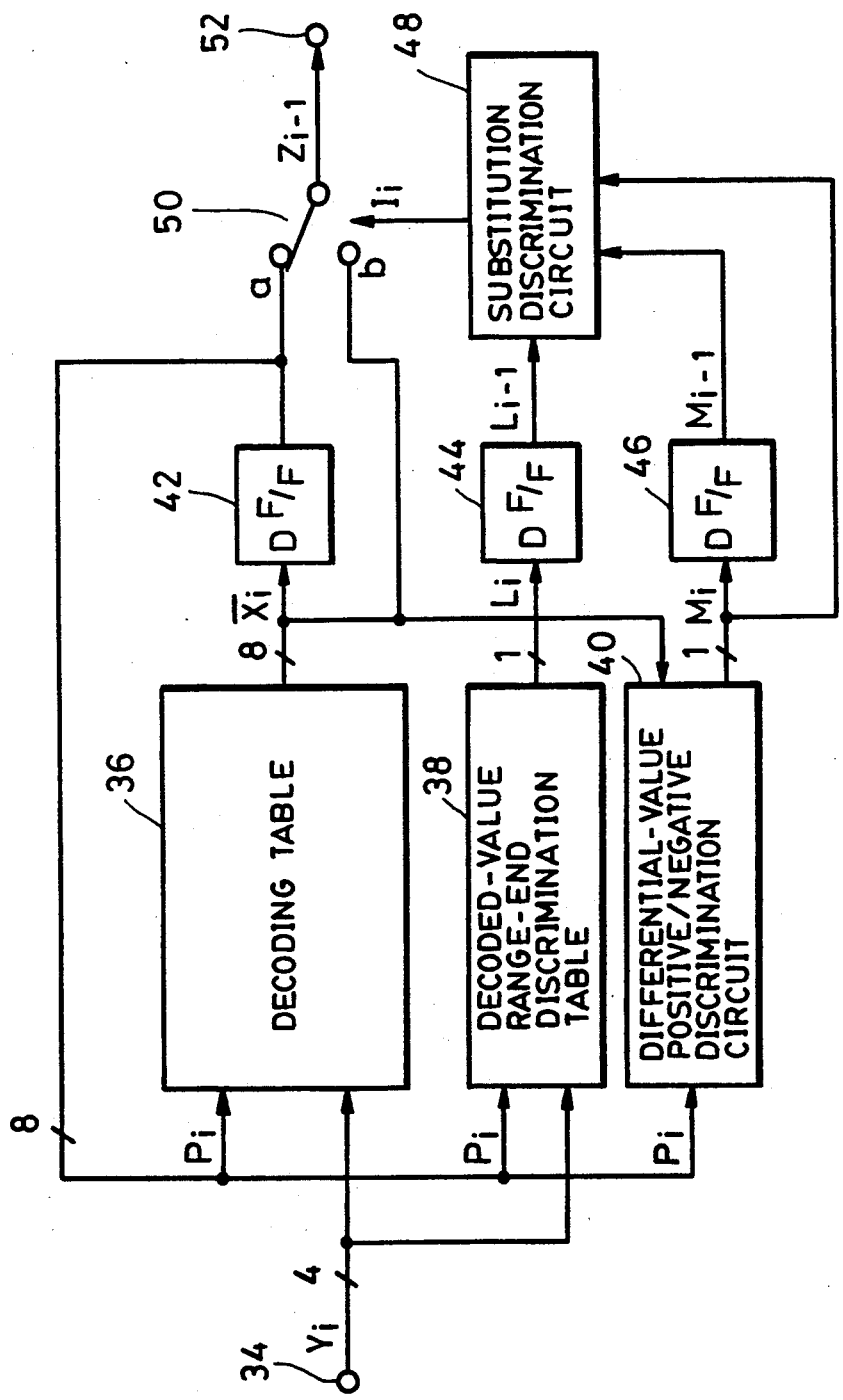

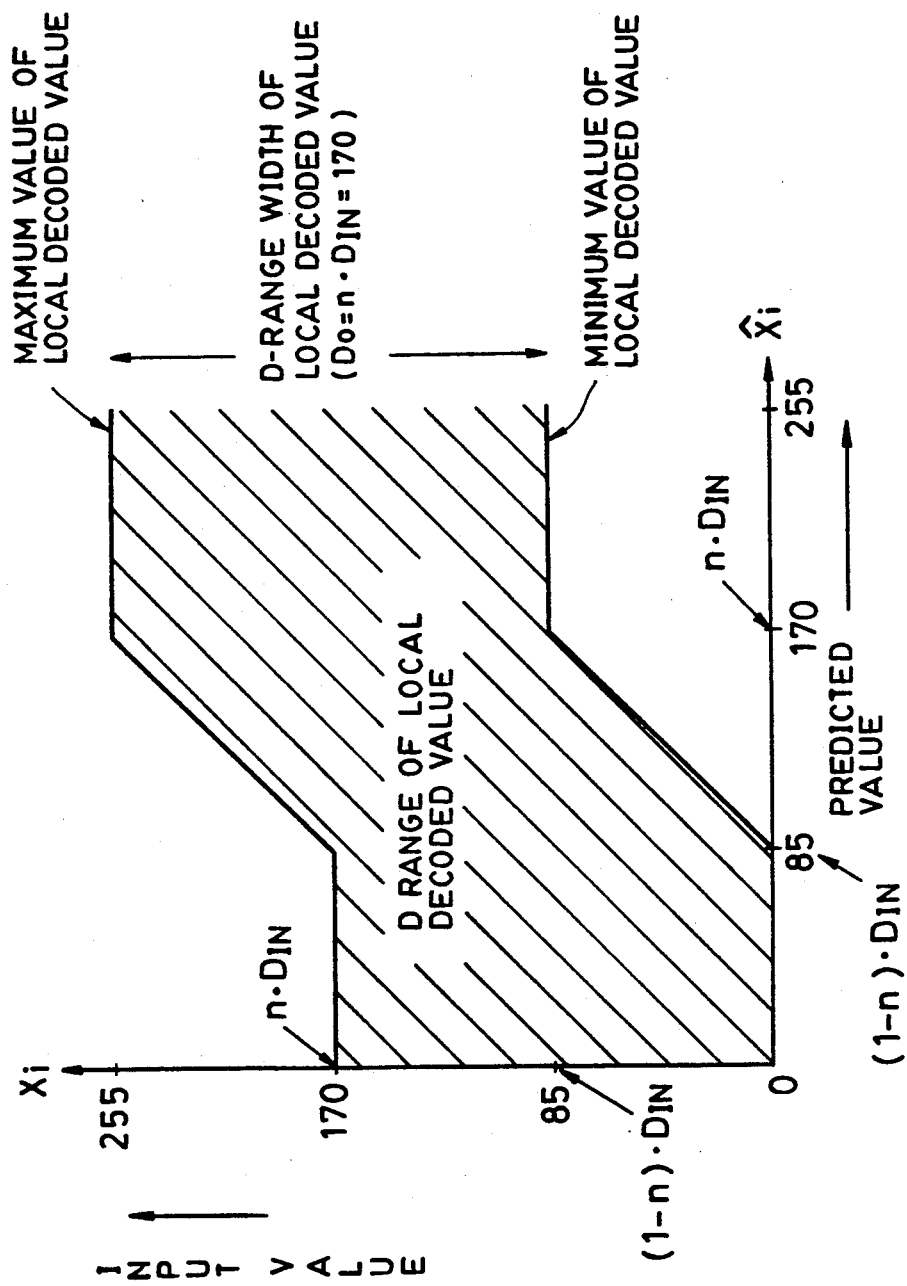

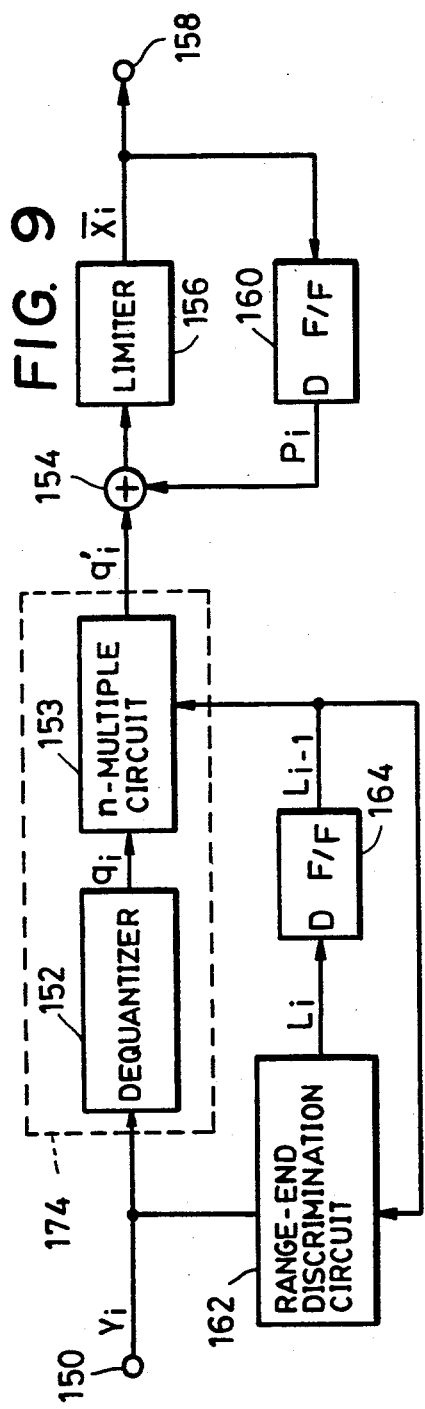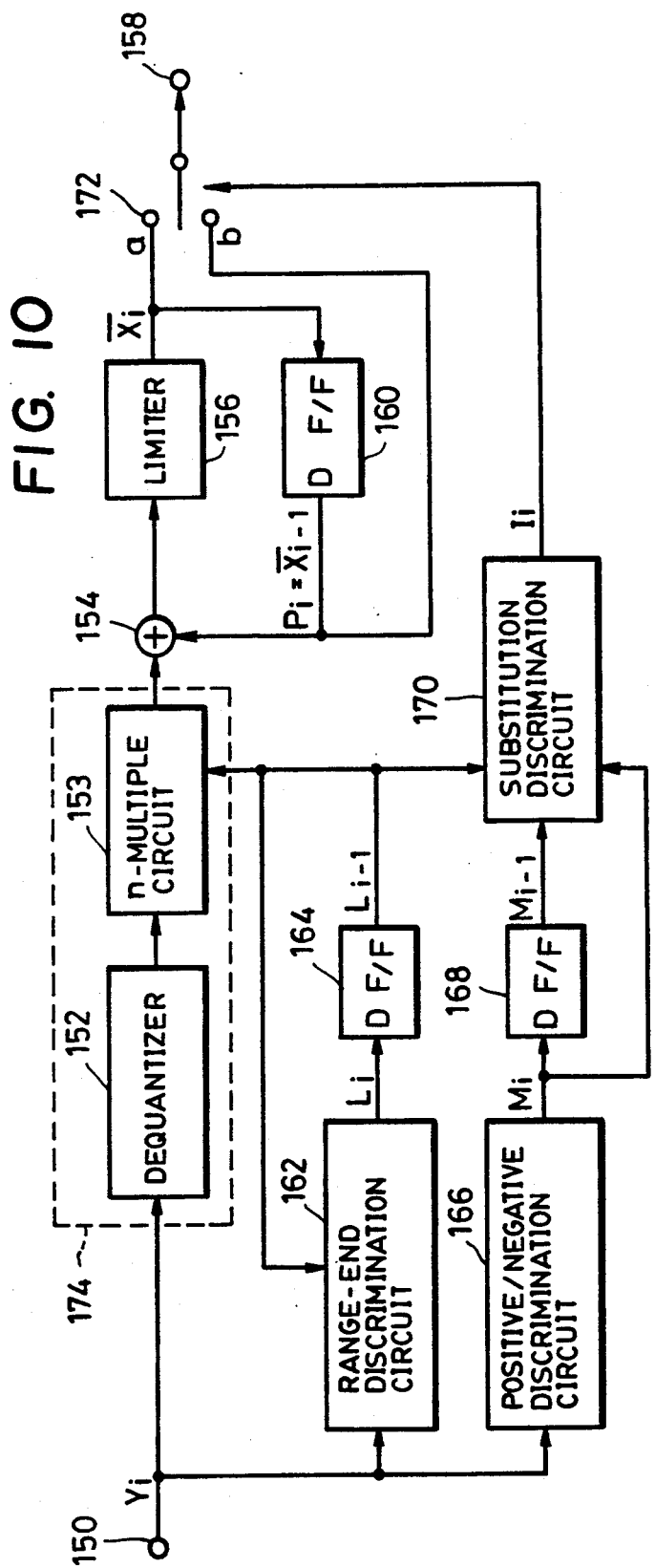

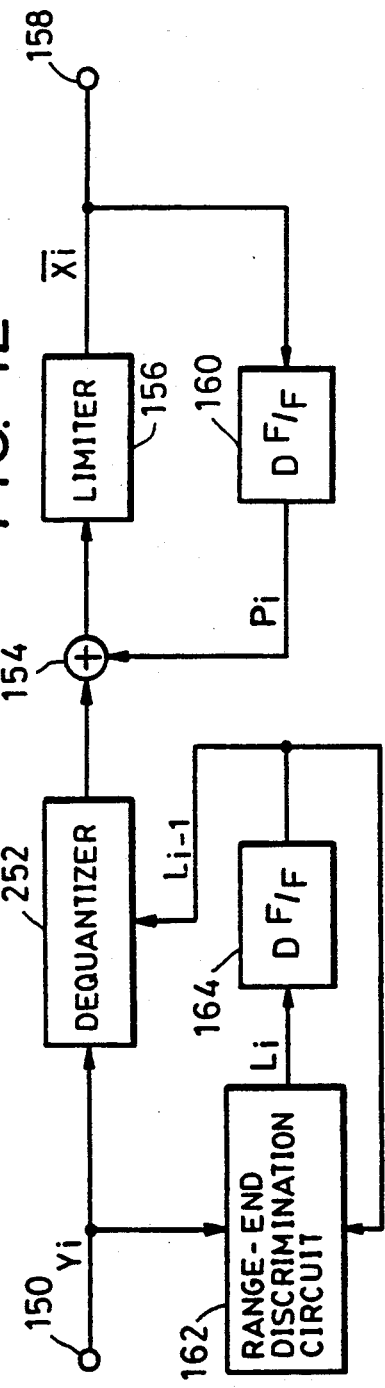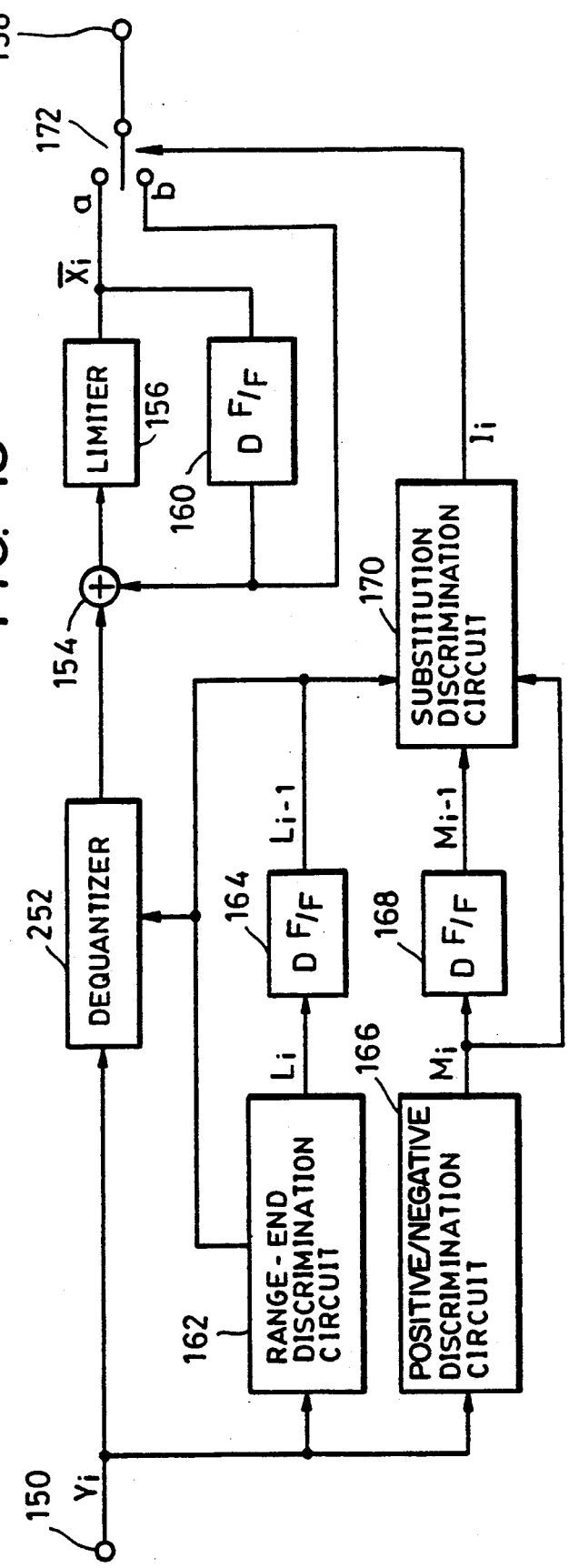

CODING DEVICE AND A DECODING DEVICE

BACKGROUND OF THE INVENTION

1. Field of the Invention

This invention relates to a coding device for coding a differential value between a sample value and its predicted value, and a decoding device for decoding a code made by coding the differential value.

2. Description of the Related Art

In transmitting image information, voice information and the like by digitizing the information, coding for reducing the amount of information to be transmitted is performed in order to economize transmission cost. Furthermore, decoding is performed in order to return the information sent by being coded to its original state.

As one of many coding methods, differential pulse code modulation (termed hereinafter DPCM) compresses the amount of information by utilizing a correlation between adjacent sample values. That is, there is adopted a method in which a coded sample value is first decoded, a predictive value for the next sample value is obtained using the decoded value (local decoded value), and the difference between the predicted value and the input sample value is quantized and coded.

FIG. 1 is a block diagram showing the configuration of a conventional coding device for performing the most simple preceding-value predictive coding.

In FIG. 1, a sample value $X_i$ as an object of coding is input to an input terminal 10. A subtracter 12 obtains a difference between the sample value $X_i$ and a predictive value $P_i$. A quantizer 14 quantizes the differential value from the subtracter 12. An output terminal 16 outputs a DPCM code $Y_i$ from the quantizer 14. A dequantizer 18 receives the output from the quantizer 14 as an input and decodes the DPCM code $Y_i$ into the differential value. An adder 20 performs addition of an output from a D-type flip-flop 24 and an output from the dequantizer 18. A limiter 22 limits the amplitude of a local decoded value $\overline{X}_i$ output from the adder 20 within a dynamic range of the input sample value. The D-type flip-flop 24 supplies the substracter 12 with the local decoded value $\overline{X}_i$ output from the limiter 22 to the subtracter 12 as the predictive value $P_{i+1}$ of the next sample value $X_{i+1}$.

Next, the operation of the configuration in FIG. 1 will be explained.

The sample value $X_i$ input to the input terminal 10 is supplied to the subtracter 12. The predicted value $P_i$ is subtracted by the subtracter 12. The differential value output from the subtracter 12 is quantized by the quantizer 14, and is output to the output terminal 16 as the DPCM code $Y_i$. The DPCM code $Y_i$ output from the quantizer 14 is also input to the dequantizer 18, where the DPCM code $Y_i$ is decoded in a quantized representative value of the differential value, and is then output to the adder 20.

In the adder 20, the preceding-value predictive value $P_i$ output from the D-type flip-flop 24 is added to the quantized representative value from the dequantizer 18. The differential value (quantized representative value) is thereby restored to the sample value (local decoded value). The restored sample value (local decoded value) is limited within a predetermined range relative to its amplitude, and is then supplied to the D-type flip-flop 24. The D-type flip-flop 24 outputs the local decoded value output from the limiter 22 in synchronization with a clock signal, and supplies it for the subtracter 12 and the adder 20 as the predictive value $P_{i+1}$ for the next sample value.

In general, the distribution of differential values of predictive values is biased at portions having small values, and it becomes therefore possible to reduce the amount of information by transmitting differential values with encoding by nonlinear quantization.

In conventional coding and decoding devices as described above, a range of values which the input sample value may have, that is, the dynamic range (termed hereinafter D range) is $0–(n-1)$. If its width is assumed to consists of n levels, the D range of the differential value becomes $(-n+1)–(n-1)$. Its width therefore consists of $(2n-1)$ levels, which is about twice the width of the D range of the input sample value. (In the present specification, for the convenience of explanation, discriminative terminology is used in which the range of allowable values is termed D range, and the width of allowable values is termed D-range width.) As a result, when the quantization characteristic is made a nonlinear characteristic, the maximum value of quantization error (the difference between the differential value before quantization and the differential value after quantization) at portions separated from the predicted value becomes a very large value. This is a big factor for deterioration in picture quality at edge portions (edge business) having large differential values.

On the other hand, if the quantization characteristic is made close to a linear characteristic in order to reduce the above-described deterioration, quantization errors at portions near the predicted value increase. This causes roughness in an reproduced image (increase of granular noise) at flat portions. That is, at a portion where the level gradually changes, like a man's face, a contour (pseudocontour) just like contour lines in a map is produced. Hence, picture quality is deteriorated.

SUMMARY OF THE INVENTION

It is an object of the present invention to solve the problems as described above.

It is a further object of the present invention to provide a coding device which can reduce deterioration in information both at an edge portion and a flat portion of a sample value.

It is a still further object of the present invention to provide a coding device which can suppress the generation of both granular noise and edge business.

These objects are accomplished, according to one aspect of the present invention, by a predictive coding device comprising (a) coding means for outputting a differential code by quantizing a differential value between an input sample value and a predictive value, (b) local decoding means for outputting a local decoded value corresponding to the differential code, and (c) predictive means for calculating the predictive value using the local decoded value, wherein characteristics of the coding means and the local decoding means are set so that the width of a range of values which the local decoded value is permitted to have is narrower than the width of a range of values which the input sample value is permitted to have.

According to another aspect, the present invention relates to a predictive coding device comprising (a) coding means for selectively outputting a first differential code provided by quantizing a differential value between an input sample value and a predictive value within a first range and a second differential code provided by quantizing the differential value within a second range the width of which is narrower the width of the first range, (b) local decoding means for outputting a local decoded value corresponding to the first or second differential code output from the coding means, and (c) predictive means for calculating the predictive value using the local decoded value.

It is still another object of the present invention to provide a decoding device which can suppress deterioration in information at an edge portion of a sample value due to overload of gradient or edge business and deterioration in information at a flat portion of a sample value due to granular noise, and which can restore excellent information.

This object is accomplished, according to one aspect of the present invention, by a predictive decoding device comprising (a) decoding means for receiving a differential code provided by coding a differential value between an input sample value and its predictive value, and for outputting a decoded value corresponding to the input sample value, (b) discrimination means for discriminating that overload of gradient is produced in the decoded value which the decoding means outputs, (c) delay means for delaying the decoded value, and (d) selection means for selectively outputting the decoded value which the decoding means outputs and the decoded value which the delay means outputs in accordance with an output of the discrimination means.

According to another aspect, the present invention relates to a predictive decoding device comprising (a) decoding means for having selectively input thereto first and second differential codes provided by quantizing a differential value between an input sample value and a predictive value within first and second quantization ranges, respectively, and for outputting a decoded value corresponding to the input sample value, (b) detection means for detecting that the differential value corresponding to the second differential code is situated at an end of its quantization range, and (c) switching means for switching a decoding characteristic of the decoding means in accordance with an output from the detection means.

These and other objects and features of the present invention will become more apparent from the following detailed description of the preferred embodiments with reference to the accompanying drawings.

BRIEF DESCRIPTION OF THE DRAWINGS

FIG. 3 is a block diagram showing an embodiment of the decoding device corresponding to the coding device in FIG. 2;

FIG. 4 is a diagram showing an example of the substitution discrimination circuit in FIG. 2;

FIG. 5 is a diagram showing a range for local decoded values in a coding device of the present invention;

FIG. 9 is a block diagram showing an embodiment of the decoding device corresponding to the coding device in FIG. 8;

FIG. 10 is a block diagram showing another embodiment of the decoding device corresponding to the coding device in FIG. 8;

FIG. 12 is a block diagram showing an embodiment of the decoding device corresponding to the coding device in FIG. 11; and FIG. 13 is a block diagram showing another embodiment of the decoding device corresponding to the coding device in FIG. 11.

DETAILED DESCRIPTION OF THE PREFERRED EMBODIMENTS

Figure 2:
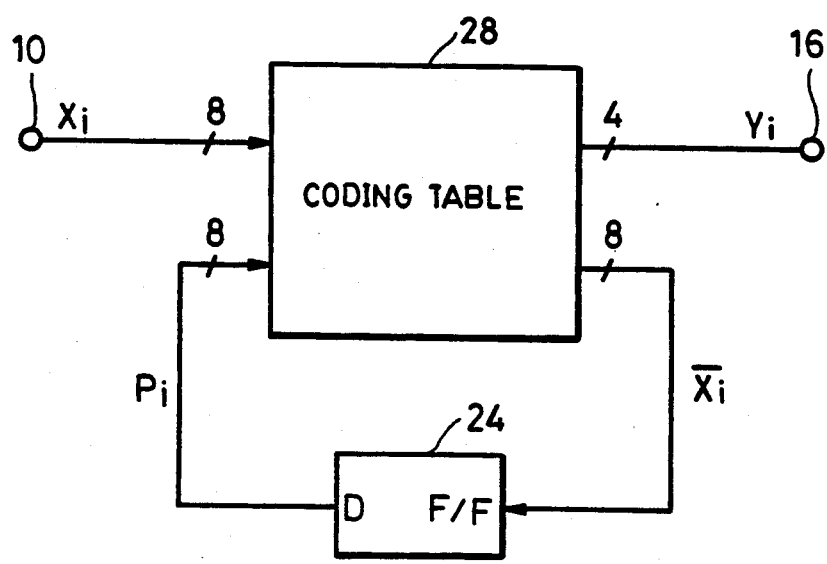
FIG. 2 is a block diagram showing an embodiment of the coding device of the present invention.

FIG. 2 is a block diagram showing the main configuration of an embodiment of the coding device of the present invention. FIG. 3 is a block diagram showing the main configuration of an embodiment of the decoding device of the present invention.

In FIG. 2, an 8-bit sample value $X_i$ is input to an input terminal 10. A coding table 28 comprises a ROM for storing a DPCM code $Y_i$ and a local decoded value $\overline{X}_i$ for the input sample value $X_i$ and a predictive value $P_i$. An output terminal 16 outputs the 4-bit DPCM code $Y_i$. A D-type flip-flop outputs the predictive value $P_i$.

In the above-described configuration, the input sample value $X_i$ input to the input terminal 10 and the predictive value $P_i$ output from the D-type flip-flop 24 are supplied as address inputs of the coding table 28 to become a 16-bit address signal. The DPCM code $Y_i$ and the local decoded value $\overline{X}_i$ for the input sample value $X_i$ and the predictive value $P_i$ are uniquely determined by determining the quantization characteristic. That is, by storing the DPCM code $Y_i$ and the local decoded value $\overline{X}_i$ corresponding to an address indicated by the input sample value $X_i$ and the predictive value $P_i$ in the coding table 28 in the ROM as a table, it is possible to provide the function of the circuit unit within the frame made by the dotted line shown in FIG. 1.

It is to be noted that the method of providing the main portion of a predictive coding circuit using a lookup table as described above has been disclosed in U.S. application Ser. No. 288,944 previously applied by the present applicant.

Now, it can be considered that the coding table 28 performs coding by dividing the D range of the input sample value by the number of quantization levels ($2^4 = 16$ in the present embodiment), allocating the DPCM code for each region, and allocating the local decoded value as the representative value of the region. Accordingly, the D-range width of a value to be quantized is the D-range width of the input sample value, which is about ½ of the D-range width of the differential value by the subtracter 12 in FIG. 1.

On the other hand, the amount of deterioration in picture quality by edge business is determined by the amount of the difference between the boundary portion and the quantized representative value in each quantization step. Furthermore, granular noise and pseudocontour are produced more easily as the step width in the vicinity of the minimum quantization step (in the vicinity of the origin of a nonlinear quantization characteristic) is larger.

From the viewpoint of such facts, in the present invention, the D-range width of the local decoded value $X_i$ is made narrower than the D-range width of the input sample value $X_i$, and the difference between the boundary portion and the local decoded value in the quantization step at a portion separated from the predicted value is made small while keeping fine the quantization characteristic in the vicinity of the predicted value. Thus, deterioration in picture quality is improved.

Next, the method of setting the D range of the local decoded value for each predictive value will be explained.

FIG. 5 is a diagram for explaining the D range of the local decoded value for the predictive value. In FIG. 5, there is shown a range for the local decoded value for each predictive value when the D-range width $D_0$ of the local decoded value relative to the D-range width $D_{IN}$ of the input sample value is $n \cdot D_{IN}$ and $n = \frac{2}{3}$. First, the D-range width $D_0$ of the local decoded value for each predictive value is compressed into n times the D-range width $D_{IN}$ of the input sample value ($D_0 = 255 \times \frac{2}{3} = 170$). Now, in order to express the D range of the input sample value by two picture elements, the maximum value (or the minimum value) of the local decoded value for each predictive value and the maximum value (or the minimum value) of the local decoded value when that local decoded value is made the predictive value must have values close to the maximum value (or the minimum value) of the input sample value. Hence, in the region where the predictive value $P_i$ is $P_i \leq (1-n)D_{IN}$, the maximum value $D_{max}$ of the local decoded value is made $$D_{max} \approx n \cdot D_{IN}.$$

Similarly, in the region where $P_i \geq n \cdot D_{IN}$, the minimum value $D_{min}$ of the local decoded value is made $$D_{min} \approx (1-n) \cdot D_{IN}.$$

Accordingly, the range (D range) of the local decoded value becomes the hatched region shown in FIG. 5.

Relative to the D range in the region where $(1-n) \cdot D_{IN} < P_i < n \cdot D_{IN}$, the D-range width of the local decoded value may always be constant and a monotonically increasing function relative to increase in the predictive values for the maximum and minimum values of the local decoded value (In FIG. 5, it is set so that values corresponding to quantized representative values of differential values are symmetrical with each other in positive and negative values).

According to the decoding device as described above, since the D-range width of the local decoded value is relatively narrow, the generation of edge business, granular noise and pseudocontour hardly occurs. Furthermore, since the D range is effectively utilized, the generation of slope overload accompanying the compression of the D-range width does not cause a big problem.

Next, the decoding device in FIG. 3 will be explained.

In FIG. 3, a 4-bit DPCM code $Y_i$ is supplied to an input terminal 34. A decoding table 36 comprises a ROM for storing the DPCM code $Y_i$ and the decoded value $\overline{X}_i$ for the predictive value $P_i$. A decoded-value range-end discrimination table 38 comprises a ROM for storing decoded-value range-end discrimination signals.

A differential-value positive/negative discrimination circuit 40 comprises a ROM for storing differential-value positive/negative discrimination signals. A D-type flip-flop 42 generates the predictive value $P_i$ by the decoded value $\overline{X}_i$ from the decoding table 36. A D-type flip-flop 44 outputs a decoded-value range-end discrimination signal $L_{i-1}$ according to a result $L_i$ of discrimination output from the decoded-value range-end discrimination table 38. A D-type flip-flop 46 outputs a differential-value positive/negative discrimination signal $M_{i-1}$ according to a differential-value positive/negative discrimination signal $M_i$ output from the differential-value positive/negative discrimination circuit 40. A substitution discrimination circuit 48 generates a substitution discrimination signal $I_i$ according to the decoded-value range-end discrimination signal $L_{i-1}$, the differential-value positive/negative discrimination signal $M_{i-1}$ and the differential-value positive/negative discrimination signal $M_{i-1}$. A switch 50 selectively outputs the predictive value $P_i$ or the decoded value $\overline{X}_i$ in accordance with the output of the substitution determination circuit 48. A switch 52 is an output terminal for outputting the decoded value $Z_{i-1}$ selected by the switch 50.

FIG. 4 shows the detailed configuration of the substitution discrimination circuit 48, which comprises an exclusive OR circuit 54 for receiving the differential-value positive/negative discrimination signal $M_i$ and the differential-value positive/negative discrimination signal $M_{i-1}$ for the preceding picture element as input signals, and an OR circuit 56 for receiving an output signal $S_i$ from the exclusive OR circuit 54 and the decoded-value range-end discrimination signal $L_{i-1}$ as input signals to output a substitution discrimination signal $I_i$.

Next, the operation of the configuration in FIG. 3 will be explained.

The DPCM code $Y_i$ input to the input terminal 34 is supplied to the decoding table 36 and the decoded-value range-end discrimination table 38. In each address determined by the 4-bit DPCM code and the 8-bit predictive value in the decoding table 36, the corresponding decoded value has previously been stored. By the supply of the DPCM code $Y_i$ and the predictive value $P_i$, the corresponding decoded value $\overline{X}_i$ is output. The decoded value $\overline{X}_i$ is supplied for the D-type flip-flop 42, and, at the next cycle, supplied as the predictive value $P_{i+1}$ for the decoding table 36, the decoded-value range-end discrimination table 38, the differential-value positive/negative discrimination circuit 40 and the switch 50.

For the decoded-value range-end discrimination circuit 38, the DPCM code $Y_i$ is supplied in addition to the predictive value $P_i$. Discrimination data have previously been stored in an address represented by the DPCM code and the predictive value in the ROM so as to execute a discrimination which satisfies the following four conditions.

(1) Level "L"

when $P_i \leq (1-n) \cdot D_{IN}$: the decoded value is at the maximum value: (that is, $\overline{X}_i \approx n \cdot D_{IN}$)

(2) level "L"

when $D_{IN} < P_i < n \cdot D_{IN}$: $\overline{X}_i$ is at a range end of the decoded value (that is, the maximum value or the minimum value), (3) level "L"

when $n \cdot D_{IN} \leq P_i$: the decoded value is at the minimum value (that is, $\overline{X}_i \approx (1-n) \cdot D_{IN}$), and (4) level "H" for cases other than those described above.

These results of discrimination are supplied for the D-type flip-flop 44 as the decoded-value range-end discrimination signal $L_i$, from which they are transmitted to the substitution discrimination circuit 48 at the next cycle.

The differential-value positive/negative discrimination circuit 40 compares the predictive value $P_i$ with the decoded value $\overline{X}_i$, and transmits a level-"L" signal to the D-type flip-flop 44 and the substitution discrimination circuit 48 as the differential-value positive/negative discrimination signal $M_i$ when $P_i > \overline{X}_i$. The differential-value positive/negative discrimination signal $M_i$ is further supplied for the substitution discrimination circuit 48 as the differential-value positive/negative discrimination signal $M_{i-1}$ for the preceding picture element by the D-type flip-flop 46 at the next cycle as well.

Using the decoded-value range-end discrimination signal $L_{i-1}$, the differential-value positive/negative discrimination signal $M_i$ and the differential-value positive/negative discrimination signal $M_{i-1}$ for the preceding picture element, the substitution discrimination circuit 48 outputs the substitution discrimination signal $I_i$ so that the switch 50 is connected to the side of a contact "b" when the following two conditions hold:

(5) polarities (negative signs) in differential values from respective predictive values for the preceding picture element and for the present picture element are identical to each other (that is, $M_i = M_{i-1}$), and (6) the decoded value for the preceding picture element is at an end of its D range, and at the same time not within the D range of the input sample value (that is, $L_{i-1} = $ level "L")

Switch 50 is connected to the side of a contact "a" for results of discrimination other than the above-described result. As shown in FIG. 4, the exclusive OR circuit 54 determines whether or not the differential-value positive/negative discrimination signal $M_{i-1}$ for the preceding picture element is identical to the differential-value positive/negative discrimination signal $M_i$ for the present picture element, and if identical ($M_{i-1} = M_i$), outputs the level-"L" signal to the OR circuit 56. The OR circuit 56 gets the logical sum of the decoded-value range-end discrimination signal $L_{i-1}$ for the preceding picture element and the output signal $S_i$ from the exclusive OR circuit 54, that is, it outputs level "L" as the substitution discrimination signal $I_i$ when the two inputs are both level "L" (the above-described discrimination conditions (5) and (6)), and it outputs level "H" as the substitution discrimination signal $I_i$ when the above-described discrimination conditions do not hold.

The switch 50 selects the side of the contact "b" when the substitution discrimination signal $I_i$ is level "L", substitutes the decoded value of the present picture element for the decoded value of the preceding picture element, and outputs it as the decoded value $Z_{i-1}$ from the output terminal 52. When the substitution discrimination signal $I_i$ is level "H", the switch 50 selects the side of the contact "a", and outputs the same decoded value as before to the output terminal 52.

Next, an explanation will be provided for a more concrete example.

Suppose that the predictive value $P_0 = 0$, the input sample value $X_0 = 0$, and $X_1 = X_2 = 255$. In the case of coding, if $P_0 = 0$ and $X_0 = 0$, the local decoded value $\overline{X}_0 = 0$. At the next cycle, $\overline{X}_0$ becomes the predictive value, and hence $P_1 = 0$. Since $X_1 = 255$, the local decoded value is subjected to limitation, and hence $\overline{X}_1 = 170$. However, at the next cycle, since $P_2 = 170$ and $X_2 = 255$, the local decoded value is not subjected to limitation, and hence $\overline{X}_2 = 255$. Thus, level 255, which represents the D-range width of the input sample value $X_i$, is almost completely decoded after two picture elements.

On the other hand, at the side of decoding, $P_0 = 0$, $X_0 = 0$, and $Y_0$ is not a code at a range end. Hence, the decoding-value range-end discrimination signal $L_0$ becomes level "H", and the differential-value positive/negative discrimination signal $M_0$ becomes level "L". Furthermore, since $P_1 = 0$, $\overline{X}_1 = 170$, and $Y_1$ is a code at a range end, $L_1 = $ level "L" and $M_1 = $ level "L". At this time, since $L_0$ is level "H", the substitution discrimination signal $I_1 = $ level "H", and $Z_0 = \overline{X}_0 = P_1$ is output to the output terminal 52. Similarly, since $P_2 = 170$ and $\overline{X}_2 = 255$, $L_2 = $ level "H" and $M_2 = $ level "L", and further $I_2 = L_1 + (M_1 + M_2) = $ level "L", the switch 50 is connected to the contact "b", and $Z_1 = \overline{X}_2 = 255$ is output to the output terminal 52.

At the next cycle, since $L_2 = $ level "H", the switch 50 selects the contact "a", and $Z_2 = \overline{X}_2 = P_3 = 255$ is output to the output terminal 52. Thus, values almost identical to the input sample values $X_0$, $X_1$ and $X_2$ are sequentially output from the output terminal 52.

Although the above-described example represents a case in which the input sample value $X_i$ changes abruptly from 0 to level 255, the present invention is not limited thereto, but can follow any change in level provided that the succeeding two picture elements have similar values.

In the decoding device having a configuration as described above, although the slope overload accompanying the compression of the D-range width of the decoded value is produced, the generation of slope overload is prevented by substituting the decoded value of the next picture element for the picture element of a portion where the slope overload is produced at the side of decoding. The discrimination of the picture element to be substituted by the decoded value of the next picture element is performed according to the following two conditions: (a) the decoded value of the present picture element is at its range end and not at a range end of the sample value, and (b) negative signs of the differential values between the predictive values and the decoded values for the present picture element and the next picture element coincide (this utilizes the fact that, when a sample value which is out of the range of the local decoded value is input, the decoded value at a range end is first selected, and a deficiency in the differential value is carried over to the next picture element, and hence signs of the differential values for the present picture element and for the next picture element coincide). Hence, misdiscrimination hardly ever occurs. Furthermore, even if a misdiscrimination occurs, deterioration in picture quality is minimally caused.

Figure 6:
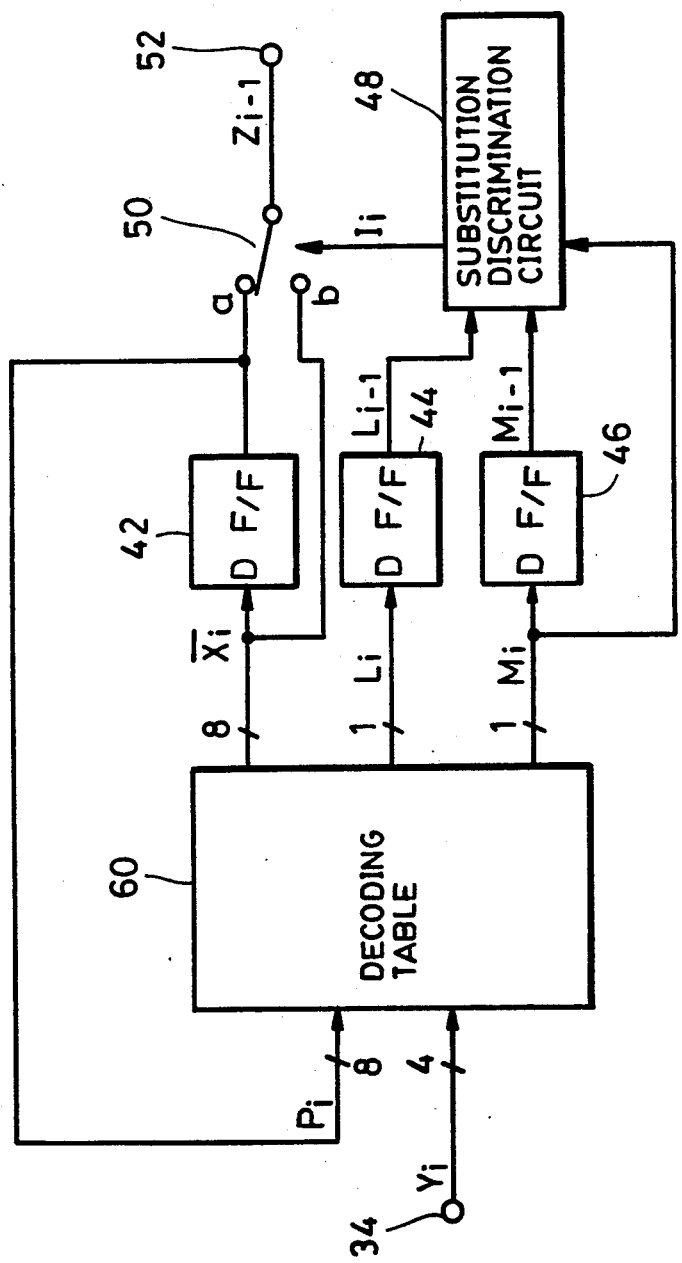
FIG. 6 is a block diagram showing another embodiment of the decoding device corresponding to the coding device in FIG. 2.

FIG. 6 is a block diagram showing another configuration of the decoding device according to the present invention. In FIG. 6, since like components as those in FIG. 3 are indicated by like numerals, repeated explanation thereof will be hereinafter omitted.

In the present embodiment, as is apparent from FIG. 6, the decoded-value range-end discrimination table 38 and the differential-value positive/negative discrimination circuit 40 in FIG. 3 are removed, and a decoding table 60 provided with the decoded-value range-end discrimination function and the differential-value positive/negative discrimination function is provided in place of the decoding table 36.

Since the decoded-value range-end discrimination signal $L_i$ and the differential-value positive/negative discrimination signal $M_i$ are uniquely determined by the DPCM code $Y_i$ and the predictive value $P_i$, they can be set in a ROM. According to such a configuration, space saving and cost reduction become possible.

Although, in the present embodiment, a configuration expressing the D range of the input sample value by two picture elements is adopted, the present invention is not limited thereto, but may also express the D range of the input sample value by three picture elements. In this case, the maximum compression rate of the local decoded value n is $\frac{1}{3}$, and it is possible to further improve edge business, granular noise and the like compared with the expression by two picture elements. Substitution processing at the decoding system in this case is as follows.

When the following two conditions are satisfied:
(a) negative signs of the differential values from respective predictive values for the second-preceding picture element, the preceding picture element and the present picture element are identical (that is, $M_i = M_{i-1} = M_{i-2}$), and
(b) the decoded values for the second-preceding picture element and the preceding picture element are at a range end ($L_{i-2}$=level "L")(exclusive of range ends of the input sample values), the second-preceding picture element and the preceding picture element are substituted by the value of the present picture element.

Figure 7:
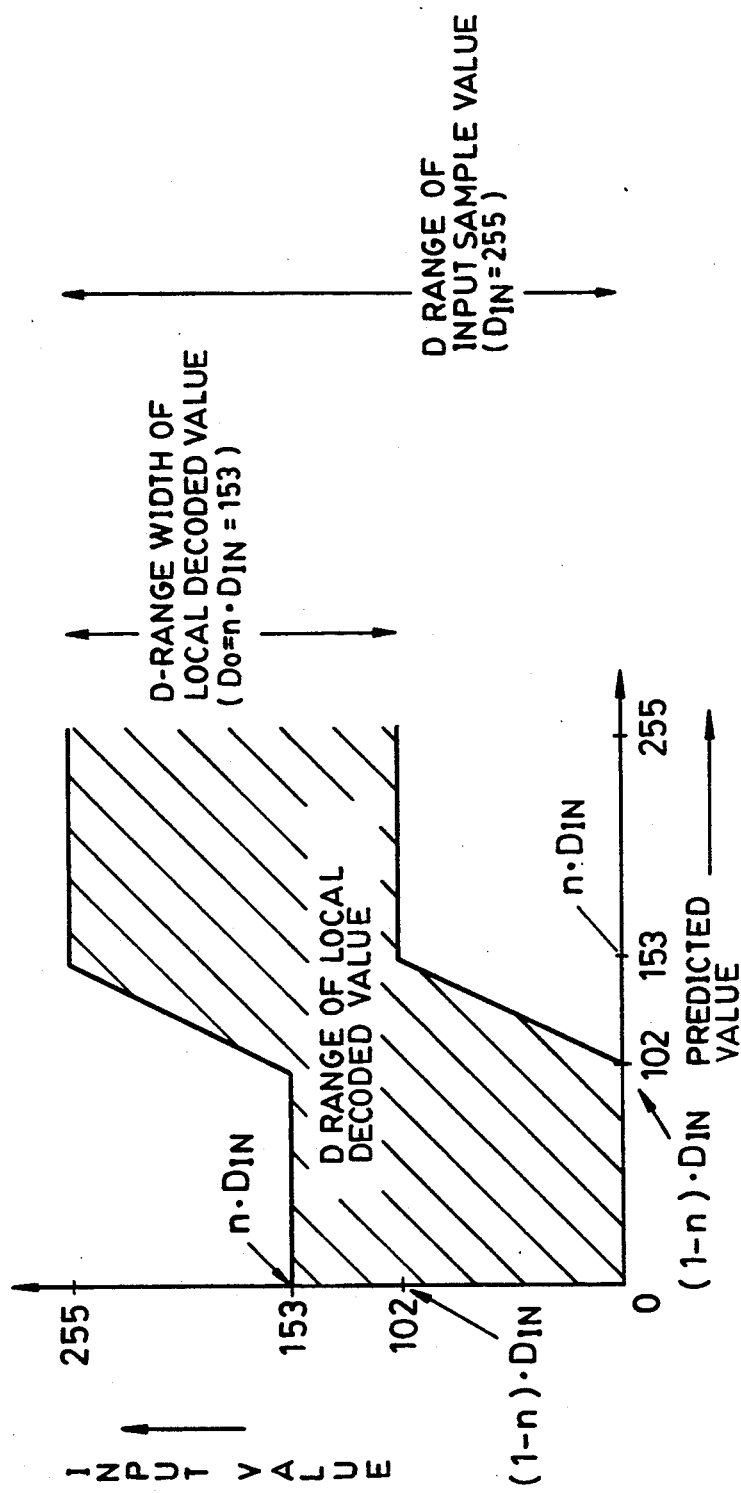
FIG. 7 is a diagram showing another range for local decoded values in a coding device of the present invention.

FIG. 7 is an explanatory diagram showing a range of the local decoded value for each predictive value when the D range of the input sample value is expressed by two picture elements and the D range of the local decoded value is compressed into n=3/5. In this case, if it is assumed that $D_{IN}$=level 255, $D_0$ is compressed into 3/5, that is, $D_0 = 255 \times 3/5 = 153$. The range of the local decoded value becomes thus narrower as n becomes smaller, but the generation probability of the slope overload becomes higher. It is to be noted that n may have any value provided that $n \geq \frac{1}{2}$.

Furthermore, in the range of the local decoded value, the maximum (minimum) value is not necessarily situated on the boundary line, but the similar effect may be obtained if it is situated in the vicinity of the boundary line.

Although, in the above-described embodiments, the preceding-value-predictive DPCM has been illustrated, the present invention is not limited thereto, but may also be applied to a DPCM coding system and decoding system for performing prediction, such as two-dimensional prediction, three-dimensional prediction, adaptive prediction and the like. In addition, the number of coding bits is not limited to that in the above-described embodiments, but the present invention may also be applied to, for example, variable-length coding systems.

Since the coding device in FIG. 2 is configured as described above, the following effects are provided. Since the D-range width of the above-described local decoded value is made a substantially constant range width which is narrower than the D-range width of the above-described input sample value, and at the same time the change of the D range of the local decoded value is limited within the D range of the input sample value, it is possible to improve deterioration due to DPCM.

More concretely, it is possible to realize suppression of deterioration in edge portions and flat portions due to the range width of the local decoded value becoming narrow while suppressing the influence of the slope overload at a minimum.

Furthermore, in the decoding devices in FIGS. 3 and 6, since the decoded value in which overload of gradient is produced is substituted for by the decoded value to be subsequently decoded by detecting the generation of the overload of gradient, it is possible to remove the influence of the slope overload, and at the same time make steep the edge portion where degradation is produced, and increase sharpness of an image.

Figure 1:
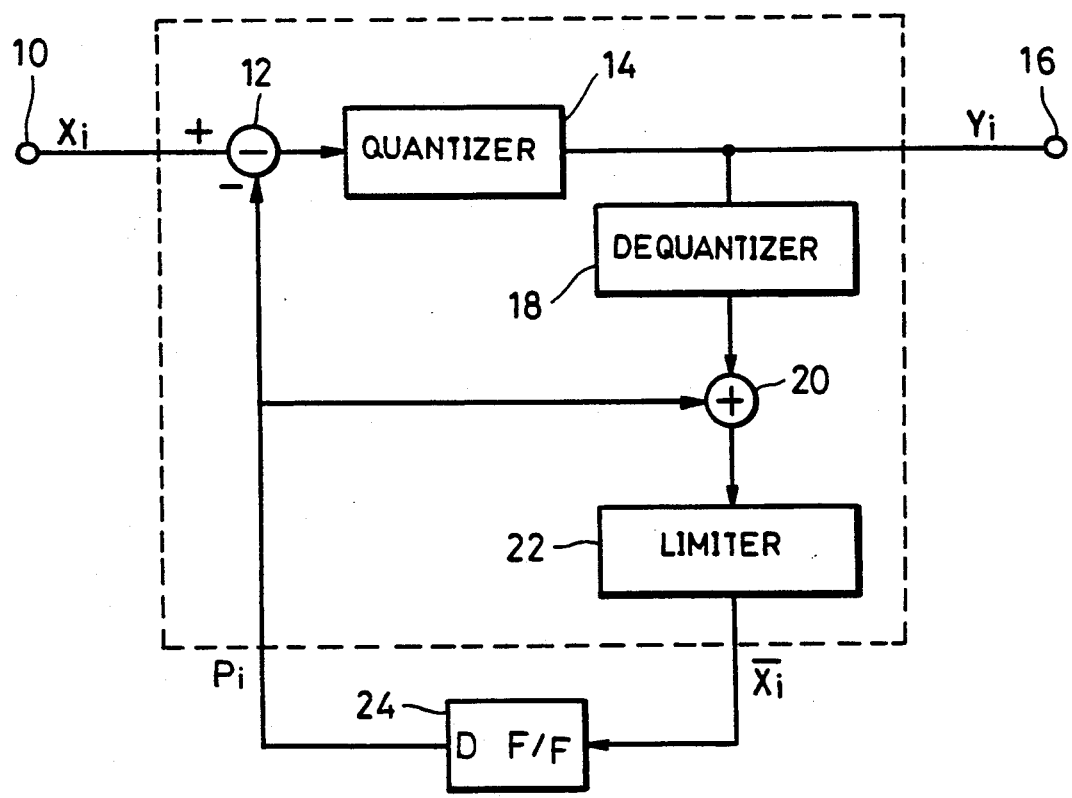
FIG. 1 is a block diagram showing the configuration of a conventional coding device.
Figure 8:
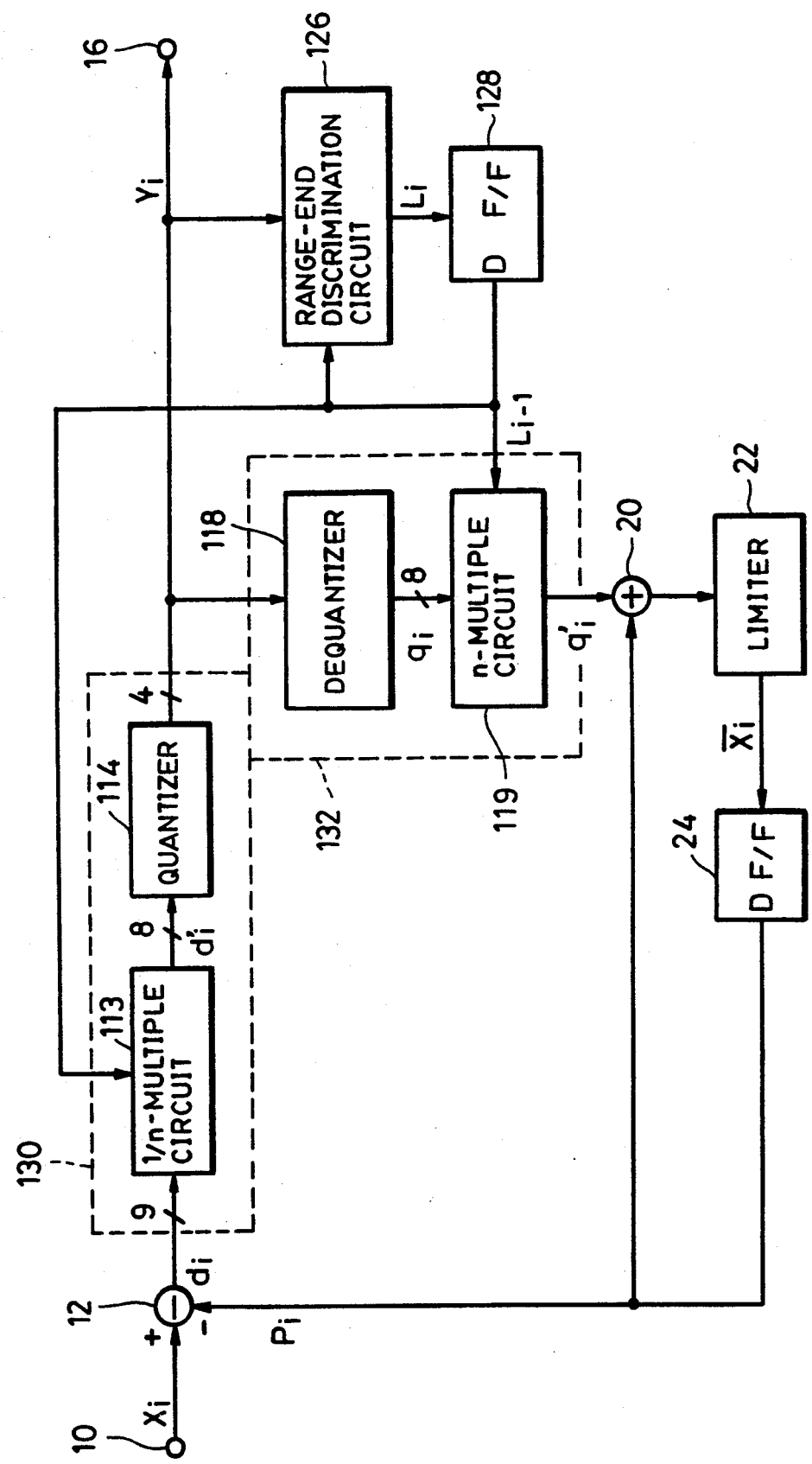
FIG. 8 is a block diagram showing another embodiment of the coding device of the present invention.

FIG. 8 is a block diagram showing the main configuration of another embodiment of the coding device of the present invention. FIG. 9 is a block diagram of a decoding system. In FIG. 8, like components as those in FIG. 1 are indicated by like numerals. Hence, repeated explanation thereof will be hereinafter omitted.

As shown in FIG. 8, the present embodiment is characterized in that there is provided a 1/n-multiple circuit 113 which compresses the differential value from the subtracter 12 by 1/n times, that is, its dynamic range is limited by 1/n, and the operation of the 1/n-multiple circuit 113 is controlled in accordance with the discrimination signal $L_i$ output from a range-end discrimination circuit 126 for discriminating whether or not the DPCM code $Y_i$ from a quantizer 114 is a code indicating a range end of the differential value.

In FIG. 8, the subtracter 12 gets the differential value between the sample value $X_i$ input from the input terminal 10 and the predictive value $P_i$. The differential value is supplied for the 1/n-multiple circuit 113. In accordance with the discrimination signal $L_{i-1}$ output from a D-type flip-flop 128, the 1/n-multiple circuit 113 compresses the differential value by 1/n times when the DPCM code of the preceding picture element indicates a range end of the differential value, and limits the amplitude of the differential value so that only the dynamic range of the differential value becomes 1/n compressed when the DPCM code of the preceding picture element indicates the differential value other than at a range end (where n is a real number such that $n > 1$: n=2 in the present embodiment).

That is, if the dynamic range of the differential value is assumed to be $-255$ to $+255$, the 1/n-multiple circuit 113 compresses the differential value $d_i$ into $d'_i = (1/n) \cdot d_i$ (where n=2) when the discrimination signal $L_{i-1}$ is level "H", clips the differential value of not more than $-128$ at $-128$ and the differential value of not less than 128 at 127 when the discrimination signal $L_{i-1}$ is level "L", and supplies the quantizer 114 with data while performing no processing for the differential values $-128$ to $+128$.

In accordance with the discrimination signal $L_{i-1}$ output from the D-type flip-flop 128, the quantizer 114 performs quantization with a full-range linear quantization characteristic from $-255$ to $+255$ when the differential value indicated by the DPCM code of the preceding picture element is situated at its range end, and performs quantization selecting a nonlinear quantization characteristic in which the range of the differential value is limited to within $-128$ to $+127$ for other cases. The DPCM code which is the output from the quantizer 114 is supplied to a dequantizer 118 and the range-end determination circuit 126.

The dequantizer 118 supplies an n-multiple circuit 119 with the quantized representative value (the quantized differential value) corresponding to the DPCM code to be input. In accordance with the above-described range-end discrimination signal $L_{i-1}$, the n-multiple circuit 119 multiplies the quantized representative value by n when the DPCM code of the preceding picture element indicates a range end of the differential value, and transmits other differential values to the adder 20 as they are for other conditions. In this case, the n-multiple circuit 119 makes the quantized representative value $q_i$ become $q'_i=2q_i$ when the range-end discrimination signal $L_{i-1}$ is level "H", and transmits $q_i$ to the adder 20 with making $q'_i=q_i$, that is, doing nothing for other conditions.

The adder 20 adds the predictive value $P_i$ to the quantized representative value $q'_i$ given from the dequantizer 132, and outputs its output (the local decoded value) to the limiter 22. The limiter 22 limits the local decoded value $X_i$ obtained by the adder 20 to the maximum value of the input sample value when it has a value not smaller than the maximum value of the input sample value, limits it to the minimum value of the input sample value when it has a value not larger than the minimum value of the input sample value, and transmits the resultant value to the D-type flip-flop 24, the D-type flip-flop 24 transmits the local decoded value $X_i$ given from the limiter 22 to the subtracter 12 as the predictive value $P_{i+1}$ by the next clock signal.

On the other hand, the range-end discrimination circuit 126 discriminates whether or not the DPCM code supplied from the quantizer 114 is at an end of the dynamic range of the differential value (that is, a value indicating the upper limit or lower limit of the quantized represented value). If the DPCM code is at an end of the range, the discrimination signal $L_i$ which becomes level "H" is transmitted to the D-type flip-flop 128. The D-type flip-flop 128 transmits the discrimination signal $L_{i-1}$ to the 1/n-multiple circuit 113 and the n-multiple 119 in synchronization with the next clock signal, to switch the operation states of these circuits. At the same time, the discrimination signal $L_{i-1}$ is also supplied to the range-end discrimination circuit 126. When the preceding picture element is at an end of the range, the quantized representative value $q'_i$ of the present picture element is not limited in its dynamic range (in this case, since the differential value $d_i$ is multiplied by 1/n before quantization and multiplied by n after quantization, it is considered that the range is not limited). Hence, the output of the range-end discrimination circuit 126 is made level "L" so that the differential value of the next picture element is quantized with a quantization characteristic in which the dynamic range is limited.

Next, the configuration of the decoding device in FIG. 9 will be explained. The DPCM code $Y_i$ output from the output terminal 16 in the coding device in FIG. 8 is input to this decoding system via a transmission channel, such as a transmission line, a telephone circuit and the like.

In FIG. 9, there is shown an input terminal 150 for the DPCM code $Y_i$. A dequantizer 152 coverts the DPCM code $Y_i$ into the differential value (quantized representative value). An n-multiple circuit 153 multiplies the quantized representative value $q_i$ by n when the discrimination signal $L_{i-1}$ from a range-end discrimination circuit 162, which will be described later, is level "H", and transmits data to an adder 154 as they are when the range-end discrimination signal $L_{i-1}$ is level "L". The adder 154 performs addition of the quantized representative value $q_i$ output from the dequantizer 152 and the predictive value output from a D-type flip-flop 160. A limiter 156 limits the output amplitude of the adder 154 to within the dynamic range of the input sample value $X_i$. An output terminal 158 is connected to the limiter 156. The D-type flip-flop 160 delays the output of the limiter 156 and outputs it as the predictive value $P_i$. The range-end discrimination circuit 162 discriminates whether or not the differential value (quantized representative value) of the present picture element is situated within its dynamic range according to the discrimination signal $L_{i-1}$ output from a D-type flip-flop 164, and outputs the discrimination signal $L_i$. The D-type flip-flop 164 delays the discrimination signal $L_i$ and transmits the discrimination signal $L_{i-1}$ to the range-end discrimination signal 162 and the n-multiple circuit 153.

Next, the operation of the configuration in FIG. 9 will be explained.

The DPCM code $Y_i$ input from the input terminal 150 is converted into the quantized representative value $q_i$ of the differential value by the dequantizer 152, and is transmitted to the n-multiple circuit 153. Like the coding device in FIG. 8, in accordance with the range-end discrimination signal $L_{i-1}$ given from the D-type flip-flop 164, the n-multiple circuit 153 multiplies the representative value $q_i$ by n when the range-end discrimination signal $L_{i-1}$ is level "H", and transmits data to the adder 154 as they are when the range-end discrimination signal $L_{i-1}$ is level "L". The adder 154 performs addition of the representative value $q'_i$ and the predictive value $P_i$ given from the D-type flip-flop 160, and transmits the decoded value $\overline{X}_i$ to the limiter 156. The limiter 156 limits the decoded value $\overline{X}_i$ to within a normal range, outputs the resultant value from the output terminal 158 as the decoded value $\overline{X}_i$, and at the same time supplies it to the D-type flip-flop 160. The D-type flip-flop 160 supplies the adder 154 with the decoded value $\overline{X}_i$ as the predictive value $P_{i+1}$ for the next picture element by a clock signal subsequently given.

On the other hand, the DPCM code $Y_i$ input to the input terminal 150 is also supplied for the range-end discrimination circuit 162. The range-end discrimination circuit 162 discriminates whether or not the differential value of the present picture element is at an end of the range from the DPCM code $Y_i$ and the range-end discrimination signal $L_{i-1}$ of the preceding picture element supplied from the D-type flip-flop 164, and transmits the range-end discrimination signal $L_i$ to the D-type flip-flop 164. The D-type flip-flop 164 transmits the range-end discrimination signal $L_{i-1}$ to the dequantizer 152 and the range-end discrimination circuit 162 by the next clock signal. The range-end discrimination signal $L_i$ of the range-end discrimination circuit 162 is reset to level "L" when the range-end discrimination signal $L_{i-1}$ of the preceding picture element is level "H". The reason for this operation is identical to that which has been explained for the range-end discrimination circuit 126 of the coding device in FIG. 8.

In the above-described coding device in FIG. 8, since the dynamic range of the differential value is limited to 1/n, the capacity of ROM's in the quantizer 114 and the dequantizers 118 and 152, which usually comprise ROM's, can be considerably small.

Furthermore, if it is assumed that $n=2^m$ (m is a natural number), the 1/n-multiple circuit 113 and the n-multiple circuits 119 and 153 can be configured by bit shift and switches, which configuration can be realized by adding only a few circuits.

It is also possible to configure the 1/n-multiple circuit 113 and the n-multiple circuits 119 and 153 by ROM's. That is, if the differential value after range-operation processing previously obtained by calculation is stored in an address indicated by the differential value and the range-end discrimination signal, and the differential value and the range-end discrimination signal are supplied to the address in a ROM, the differential value after range-operation processing can be obtained after the read cycle time of the ROM. In this case, it is possible to set an arbitrary real number which is larger than 1 as n.

Furthermore, if portions indicated by circuit units 130 and 132 within the frames made by the dotted lines in FIG. 8 and a circuit unit 174 within the frame made by the dotted line in FIG. 9 are configured by one ROM, it is possible to simplify the circiuits, and the capacity of the ROM for the entire circuits become very small. In addition, since the number of stages of ROM's becomes one half compared with the above-described configuration, any delay in the signal due to the ROM is decreased, and hence it is possible to provide high speed. In this case as well, it is, of course, possible to set n to an arbitrary real number which is larger than 1.

By providing a configuration as described above, since the width of the dynamic range of the differential value to be quantized can be made narrow, it is possible to set the quantization step to a small value. It is accordingly possible to reduce granular noise, deterioration in picture quality at flat portions such as pseudocontour and the like, and deterioration in picture quality at edge portions such as edge business and the like.

Furthermore, since influence of the slope overload a this time is present only on one picture element, it is also possible to make rising at an edge portion steep.

FIG. 10 is a block diagram of another embodiment of the decoding device. In the present embodiment, since like components as those used in the configuration in FIG. 9 are indicated by like numerals, a repeated explanation will be omitted.

The present embodiment is characterized in that, in addition to the configuration in FIG. 9, it further comprises a positive/negative discrimination circuit 166 for discriminating whether the differential value (quantized representative value) indicated by the DPCM code $Y_i$ has a positive value or a negative value and outputting the positive/negative discrimination signal $M_i$, a D-type flip-flop 168 for delaying the positive/negative discrimination signal $M_i$ to output the positive/negative discrimination signal $M_{i-1}$ for the preceding picture element, a decoded-value substitution discrimination circuit 170 for detecting the slope overload and discriminating whether or not the decoded value of the present picture element is to be substituted by the decoded value of the next picture element, and a switch 172 for selecting the output from the limiter 156 or the output from the D-type flip-flop 160 according to an output signal from the decoded-value substitution discrimination circuit 170.

The detection of the presence of overload of gradient is performed according to two conditions: (i) the DPCM code for the present picture element indicates an end of the range of the quantized representative value, and (ii) positive or negative values of the differential values of the present picture element and the immediately-succeeding picture element coincide. When these two conditions are satisfied, it is determined that there is overload of gradient. In the present embodiment, when it is determined that there is overload of gradient, the decoded value of the picture element in which the overload of gradient is produced is substituted by the decoded value of the next picture element in which the slope overload is converged, to remove deterioration in picture quality due to overload of gradient.

Next, the operation of the embodiment in FIG. 10 will be explained.

The DPCM code $Y_i$ input to the input terminal 150 is supplied to the positive/negative discrimination circuit 166. The positive/negative discrimination circuit 166 discriminates whether the differential value indicated by the DPCM code $Y_i$ has a positive value or a negative value, and transmits the positive/negative discrimination signal $M_i$, which becomes "H" for a negative value and "L" for a positive value, to the D-type flip-flop 168 and the decoded-value substitution discrimination circuit 170. The D-type flip-flop 168 reads the positive/negative discrimination signal $M_i$ at the next clock cycle, and transmits the positive/negative discrimination signal $M_{i-1}$ to the decoded-value substitution discrimination circuit 170.

To the decoded-value substitution discrimination circuit 170, the range-end discrimination signal $L_{i-1}$ for the present picture element from the D-type flip-flop 164 and the positive/negative discrimination signal $M_i$ for the next picture element from the positive/negative discrimination circuit 166 have been input in addition to the positive/negative discrimination signal $M_{i-1}$ from the D-type flip-flop 168. If it is assumed that a range end is indicated when the range-end discrimination signal $L_{i-1}$ is level "H", the above-described two conditions (i) and (ii) can be expressed by $L_{i-1}=$"H" for (i), and $M_i=M_{i-1}$ for (ii). The decoded-value substitution discrimination circuit 170 is driven so that the switch 172 is connected to the side of the contact "a" when the two conditions (i) and (ii) are both satisfied. The switch 172 is usually connected to the contact "b", and the output $\overline{X}_{i-1}$ from the D-type flip-flop 160 is output as the decoded value. When overload of gradient is produced, the switch 172 is switched from the contact "b" to the contact "a", and the decoded value $\overline{X}_i$ for the next picture element in which overload of gradient is converged is output because the differential value of the next picture element is not limited in its dynamic range. At the next clock cycle, the above-described condition (i) is not satisfied because the range-end discrimination signal $L_{i-1}$ is reset. Hence, the switch 172 is connected again to the contact "b", and the identical decoded value is output to remove the slope overload.

Since the coding device shown in FIG. 8 is configured as described above, it has the following effects. Since the range width of the dynamic range of the differential value between the sample value and it predictive value is made narrower than the range width of the dynamic range of the input sample value, it is possible to prevent the generation of granular noise, edge business and the like. Furthermore, it is possible to reduce the influence of overload of gradient at edge portions by compressing the differential value into 1/n (n>1). That is, it becomes possible to suppress the influence of the slope overload within one picture element, and thus to reduce deterioration in picture quality.

Furthermore, in the decoding devices shown in FIGS. 9 and 10, quantization error in the decoded value relative to the original sample value can usually be made small, and the influence by slope overload can also be removed because gradient at an edge can be made steep by expanding the representative value relative to the differential value to n times. Sharpness of an image is thereby increased, and it is possible to provide for a high picture quality.

Figure 11:
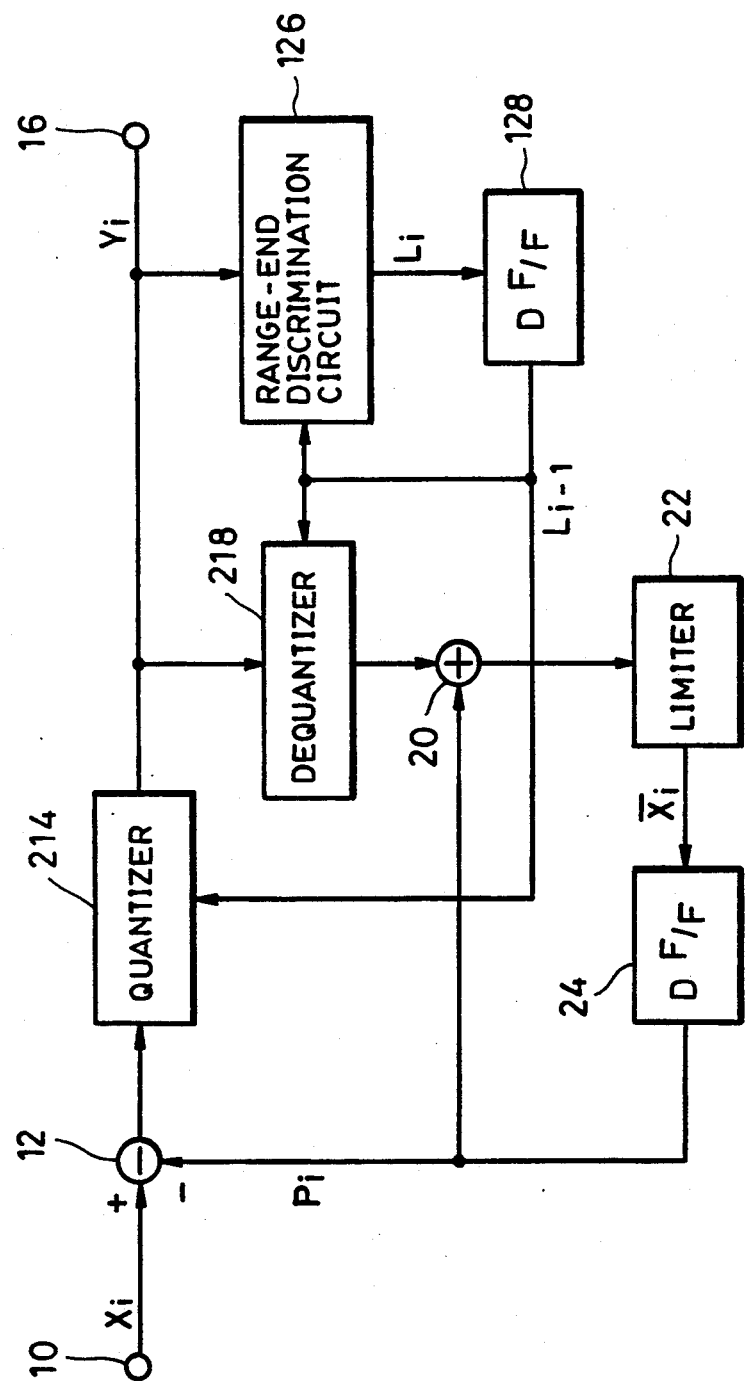
FIG. 11 is a block diagram showing still another embodiment of the coding device of the present invention.

FIG. 11 is a block diagram showing the main configuration of still another embodiment of the coding device of the present invention. FIG. 12 is a block diagram showing an embodiment of the decoding device of the present invention.

Since, in FIG. 11, like components as those in FIG. 1 are indicated by like numerals, repeated explanation thereof will be hereinafter omitted.

As shown in FIG. 11, the present embodiment is characterzed in that it controls characteristics of a quantizer 214 and a dequantizer 218 in accordance with the discrimination signal $L_i$ output from the range-end discrimination circuit 126 for discriminating whether or not the DPCM code from the quantizer 214 is a code indicating a range end of the differential value (quantized representative value). In FIG. 11, line components as those in FIG. 8 are indicated by like numerals, and explanation thereof will be omitted.

In FIG. 11, the differential value between the sample value $X_i$ input from the input terminals 10 and the predictive value $P_i$ is obtained by the subtracter 12, and the differential value is supplied for the quantizer 214. In accordance with the discrimination signal $L_{i-1}$ output from the D-type flip-flop 128, the quantizer 214 performs linear quantization of the differential value without limiting the dynamic range when the DPCM code for the preceding picture element indicates a range end of the quantized representative value, and performs nonlinear quantization with limiting the range of the differential value for other cases. The quantizer 214 outputs the DPCM code $Y_i$ to the dequantizer 218 and the range-end discrimination circuit 126.

The dequantizer 218 discriminates quantization characteristic of the quantizer 214 according to the discrimination signal given from the D-type flip-flop 128, and supplies the adder 20 with the quantized representative value (quantized differential value) corresponding to the DPCM code to be input. The adder 20 adds the predictive value $P_i$ to the quantized prepresentative value given from the dequantizer 218, and outputs its output (the local decoded value) to the limiter 22. The operation for obtaining the predictive value from the output of the limiter 22 is indentical to that for the device in FIG. 8.

On the other hand, the range-end discrimination circuit 126 discriminates whether or not the DPCM code supplied from the quantizer 214 is at a range end of the differential value (that is, a value indicating the upper or lower limit value of the quantized representative value). If the DPCM code is at a range end, the discrimination signal $L_i$ which becomes level "H" is transmitted to the D-type flip-flop 128. The D-type flip-flop 128 transmits the discrimination signal $L_{i-1}$ to the quantizer 214 and the dequantizer 218 in synchronization with the next clock signal to switch the quantization characteristic. At the same time, the discrimination signal $L_{i-1}$ is also supplied for the range-end discrimination circit 126. When the preceding picture element is at a range end, the range-end discrimination circuit 126 makes the output of the range-end discrimination circuit 126 level "L", because the quantized representative value of the present picture element has been quantized by the quantizer 214 with a quantization characteristic in which dynamic range is not limited. It is then arranged so that the differential value of the next picture element is quantized by a quantization characteristic in which dynamic range is limited.

Next, the configuration in FIG. 12 will be explained. The DPCM code $Y_i$ output from the output terminal 16 of the coding system in FIG. 11 is connected to this decoding system via a transmission channel, such as a transmission line, a telephone circuit and the like.

In FIG. 12, there is shown the input terminal 150 for the DPCM code $Y_i$. A dequantizer 252 converts the DPCM code $Y_i$ into the differential value (quantized representative value). Like components as those in FIG. 9 are indicated by like numerals.

Next, the operation of the configuration in FIG. 12 will be explained.

The DPCM code $Y_i$ input from the input termials 150 is converted into the quantized representative value of the differential value by the dequantizer 252. The converted value is transmitted to the adder 154, and added to the predictive value $P_i$ given from the D-type flip-flop 160. The operation after the adder 154 is identical to that for the decoder in FIG. 9.

The dequantizer 252 switches the quantization characteristic so that the quantization characteristic coincides with that at the coding said according to the discrimination signal $L_{i-1}$. The discrimination signal $L_i$ of the range-end discrimination circuit 162 is reset to level "L" when the discrimination signal $L_{i-1}$ for the preceding picture element is level "H", as in the coding side. The reason for this operation is identical to the reason explained for the range-end discrimination circuit 126 in the coding device in FIG. 11.

As explained above, by providing the range-end discrimination circuit 162 and the D-type flip-flop 164 corresponding to the configuration of the range-end discrimination circuit 126 and the D-type flip-flop 128 at the side of the coding device, faithful decoding becomes possible.

By proving a configuration as described above, since the width of the dynamic range of the differential value to be quantized can be made narrow, it is possible to set the quantization step to a small value. It is accordingly possible to reduce granular noise, both deterioration in picture quality at flat portions such as pseudocontour and the like, and deterioration in picture quality at edge portions such as edge business and the like.

Futhermore, since the influence of the slope overload at this time is present only on one picture element, it is also possible to make rising at an edge portion steep.

FIG. 13 is a block diagram showing the configuration of another embodiment of the decoding device of the present invention. In the present embodiment, since like components as those used in the configuration in FIG. 12 are indicated by like numerals, repeated explanation thereof will be omitted.

The present embodiment is characterized in that, in addition to the configuration in FIG. 12, it further comprises a positive/negative discrimination circuit 166 for discriminating whether the differential value (quantized representative value) indicated by the DPCM code $Y_i$ has a positive value or a negative value and outputting the positive/negative discrimination signal $M_i$, a D-type flip-flop 168 for delying the positive/negative discrimination signal $M_i$ to output the positive/negative discrimiation signal $M_{i-1}$ for the preceding picture element, a decoded-value substitution discrimination circuit 170 for detecting overload of gradient and discriminating whether or not the decoded value for the present picture element is to be substituted by the decoded value for the next picture element, and a switch 172 for selecting the output from the limiter 156 or the output from the D-type flip-flop 160 according to an output signal from the decoded-value substitution discrimination circuit 170.

Functions and effects accompanying the addition of these compositional requirements are identical to those in FIG. 10, and explanation thereof will be omitted.

As explained above, according to the coding device in FIG. 11, since the quantization step can usally be set to a small value by performing coding with a first quantization characteristic, it is possible to prevent the generation of granular noise and edge business at flat portions. Furthermore, the influence of the slope overload at edge portions can be reduced by performing coding with a second quantization characteristic.

Furthermore, according to the decoding devices in FIGS. 12 and 13, quantization error can usually be suppressed to a small value by performing decoding with a first dequantization characteristic. When the slope overload is produced at an edge pportion, its influence can be reduecd by performing decoding with a second dequantization characteristic.

Although the present invention has been described in connection with a number of preferred embodiments, it will be apparent to one of ordinary skill in the art that many changes and variations may be made therein without departing from the scope of the present invention, which is to be determined by reference to the appended claims.

What is claimed is:

1. A predictive coding device comprising:
   (a) coding means for outputting a differential code of m bits quantizing a differential value between an input sample value of n bits and a predictive value, m and n being integers, and m being smaller than n;
   (b) local decoding means for outputting a local decoded value of n bits for said input sample value, said local decoded value being determined according to said differential code; and
   (c) predictive means for calculating said predictive value by using said local decoded value, wherein characteristics of said coding means and said local decoding means are set so that a width of a range of values which said local decoded value is permitted to have is narrower than a width of a range of values which said input sample value is permitted to have, irrespective of said input sample value.

2. A device according to claim 1, wherein characteristics of said coding means and said local decoding means are set so that the range of values which said local decoded value is permitted to have is inclined within the range of values which said input sample value have is permitted to have, and the width of the range which said local decoded value is permitted to have is substantially constant irrespective of said input sample value.

3. A device according to claim 2, wherein the characteristics of said coding device and said local decoding device are set so that, when it is assumed that the range of values which said input sample value is permitted to have is 0–$D_{in}$, where $D_{in}$ is a value corresponding to the width of the range of values which said input sample values are permitted to have, and said predictive value is $P_i$, the range of values which the local decoded value is permitted to have becomes approximately $0 - n \cdot D_{in}$ when $P_i \leq (1-n) \cdot D_{in}$, and becomes approximately $(1-n) \cdot D_{in} - D_{in}$ when $P_i \leq n \cdot D_{in}$, where $\frac{1}{2} < n > 1$.

4. A device according to claim 1, wherein said coding means quantizes said differential value limited within a predetermined range of values the width of which is narrower than the width of a range of values which said differential value is permitted to have, irrespective of said input sample value.

5. A device according to claim 1, wherein said coding means includes difference means for calculating the differential value between said input sample value and said predictive value, and quantization means for outputting said differential code by quantizing said differential value, and wherein said local decoding means includes dequantization means for outputting a quantized representative value provided by dequantizing said differential code, and addition means for adding said quantized representative value and said predictive value.

6. A predictive coding device comprising:
   (a) coding means for outputting a differential code provided by quantizing a differential value between an input sample value and a predictive value, the differential value being limited within a predetermined range of values a width is narrower than a width of a range of a values which said differential value is permitted to have, irrespective of said input sample value;
   (b) local decoding means for outputting a local decoded value corresponding to said differential code; and
   (c) predictive means for calculating said predictive value using said local decoded value.

7. A device according to claim 6, wherein said coding means including difference means for calculating the differential value between said input sample value and said predictive value, and quantization means for outputting said differential code by quantizing said differential value within a range the width of which is narrower than the width of a range of values which said differential value may have, and wherein said local decoding means includes dequantization means for outputting a quantized representative value provided by dequantizing said differential code, and addition means for adding said quantized representative value and said predictive value.

8. A predictive coding device comprising:
   (a) coding means for selectively outputting a first differential code provided by quantizing a differential value between an input sample value and a predictive value within a first range of values and a second differential code provided by quantizing said differential value within a second range of values a width of which is narrower a width of said first range of values;
   (b) local decoding means for outputting a local decoded value corresponding to a selected one of the first and second differential code output from said coding means; and
   (c) predictive means for calculating said predictive value using said local decoded value.

9. A device according to claim 8, wherein said coding means selectively quantizes a limited differential value provided by limiting said differential value within said second range of values and a value which is 1/n of said differential value with a common quantization characteristic, where n>1.

10. A device according to claim 9, wherein said coding means includes difference means for calculating the differential value between said input sample value and said predictive value, compression means for selectively outputting the value which is 1/n of said differential value and said limited differential value, and quantization means for quantizing the value output from said compression means within said second range of values and selectively outputting said first differential code and said second differential code.

11. A device according to claim 10, wherein said local decoding means includes dequantization means for outputting a quantized representative value provided by selectively dequantizing said first differential code and said second differential code, expansion means for selectively outputting a value which is n multiplied by said quantized representative value and said quantized representive value, and addition means for adding the value output from said expansion means and said predictive means.

12. A device according to claim 8, wherein said coding means quantizes said differential value selectively using a first quantization characteristic for performing quanization within said first range and a second quantization characteristic for performing quantization within said second range, and selectively outputs the first differential code and the second differential code.

13. A device according to claim 12, wherein said coding means includes difference means for calculating the differential value between said input sample value and said predictive value, and quantization means for quantizing said differential value selectively using the first quantization characteristic for performing quantization within said first range and the second quantization characteristic for performing quantization within said second range and selectively outputting the first differential code and the second differential code.

14. A device according to claim 13, wherein said local decoding means includes dequantization means for outputting a quantized representative value provided by dequantizing said first and second differential codes with first and second dequantization characteristics, respectively, and addition means for adding said quantized representative value and said predictive value.

15. A device according to claim 12, wherein said first quantization characteristic is a linear characteristic, and said second quantization characteristic is a nonlinear characteristic.

16. A device according to claim 8, wherein said first range is unlimited, and said second range has a width which is narrower than the width of a range of values which said input sample value is permitted to have.

17. A device according to claim 8, wherein said coding means includes discrimination means for discriminating that said differential value is at an end of said second range, and wherein said coding means selectively outputs said first differential code and said second differential code in accordance with an output of said discrimination means.

18. A device according to claim 17, wherein, when said differential value is at an end of said second range, a differential code which said coding means subsequently outputs is made said first differential code.

19. A device according to claim 17, wherein said discrimination means discriminates that said differential value is at an end of said second range using the differential code which said coding means outputs.

20. A predictive decoding device comprising:
(a) decoding means for receiving a differential code provided by coding a differential value between an input sample value and its predictive value, and for outputting a decoded value corresponding to said input sample value;
(b) discrimination means for discriminating that a slope overload is produced in the decoded value which said decoding means outputs;
(c) delays means for delaying said decoded value; and
(d) selection means for selectively outputting the decoded value which said decoding means outputs and the decoded value which said delay means outputs in accordance with an output of said discrimination means.

21. A device according to claim 20, wherein said discrimination means includes first detection means for detecting that said decoded value is at an end of a range of values which it is permitted to have.

22. A device according to claim 21, wherein said first detection means detects that said decoded value is at an end of the range of values which it may have, and said decoded value is not at an end of a range of values which said input sample value may have.

23. A device according to claim 22, wherein said selectively means outputs the decoded value which said decoding means outputs when said detection means has detected that said decoded value is at an end of the range of values which it is permitted to have and said decoded value is not at an end of range of values which said input sample value is permitted to have, and outputs the decoded value which said delay means output in other cases.

24. A device according to claim 21, wherein said discrimination means includes a second detection means for detecting that positive or negative signs of the differential values corresponding to successive ones of said differential codes are the same.

25. A device according to claim 24, wherein said decoding means includes predictive means for outputting a predictive value using said decoded value, and forms said decoded value according to said predictive value and said differential code.

26. A device according to claim 25, wherein said second detection means includes comparison means for comparing said predictive value with the decoded value corresponding to said predictive value.

27. A device according to claim 20, wherein said discrimination means detects the decoded value in which a slope overload is produced in accordance with said differential code.

28. A predictive decoding device comprising:
(a) decoding means for having selectively input thereto first and second differential codes provided by quantizing a differential value between an input sample value and a predictive value within first and second quantization ranges, and for outputting a decoded value corresponding to said input sample value;
(b) detection means for detecting that the differential value corresponding to said second differential code is situated at an end of its quantization range; and
(c) switching means for switching a decoding characteristic of said decoding means in accordance with an output from said detection means.

29. A device according to claim 28, wherein said decoding means obtains said decoded value selectively using first and second dequantization characteristics corresponding to quantization characteristics of said first and second differential codes, respectively.

30. A device according to claim 28, wherein said decoding means includes dequantization means for having selectively input thereto said first and second differential codes, and arithmetic means for calculating said decoded value selectively using a quantized representative value which said dequantization means outputs and an expanded represetative value provided by expanding said quantized representative value to n times (n>1).

31. A device according to claim 28, further comprising:

discrimination means for discriminating that slope overload is produced in the decoded value which said decoding means outputs;

delay means for delaying said decoded value; and selection means for selectively outputting the decoded value which said decoded means outputs and the decoded value which said delay means outputs.

32. A device according to claim 31, wherein said discrimination means includes a detection circuit for detecting that positive or negative signs of successive ones of the differential values corresponding to said differential codes are the same, and said discrimination means controls said selection means according an output from said detection means and an output from said detection circuit.

* * * * *

UNITED STATES PATENT AND TRADEMARK OFFICE
CERTIFICATE OF CORRECTION

PATENT NO. : 5,107,519
DATED : April 21, 1992
INVENTOR(S) : HISASHI ISHIKAWA ET AL It is certified that error appears in the above-identified patent and that said Letters Patent is hereby corrected as shown below:

COLUMN 5

Line 3, "$X_i$" should read --$\overline{X}_i$--.

COLUMN 6

Line 17, "signal $M_{i-1}$" should read --signal $M_i$--.

COLUMN 9

Line 43, "$n \geq \frac{1}{2}$." should read --$n > \frac{1}{2}$.--.

COLUMN 11

Line 38, "n-multiple 119" should read --n-multiple circuit 119--.

UNITED STATES PATENT AND TRADEMARK OFFICE
CERTIFICATE OF CORRECTION

PATENT NO. : 5,107,519

DATED : April 21, 1992

INVENTOR(S) : HISAHI ISHIKAWA ET AL

It is certified that error appears in the above-identified patent and that said Letters Patent is hereby corrected as shown below:

COLUMN 17

Line 38, "quantizing" should read --by quantizing--.
Line 58, "have" (first occurrence) should be deleted.

COLUMN 18

Line 4, "$\frac{1}{2}<n>1.$" should read --$\frac{1}{2}<n<1.$--.
Line 27, "width is" should read --width of which is--.
Line 57, "narrower a" should read --narrower than a--.
Line 61, "code" should read --codes--.

COLUMN 19

Line 26, "quanization" should read --quantization--.

UNITED STATES PATENT AND TRADEMARK OFFICE
CERTIFICATE OF CORRECTION

PATENT NO. : 5,107,519
DATED : April 21, 1992
INVENTOR(S) : HISAHI ISHIKAWA ET AL It is certified that error appears in the above-identified patent and that said Letters Patent is hereby corrected as shown below:

COLUMN 20

Line 28, "selectively" should read --selection--.
    Line 34, "output" should read --outputs--.

COLUMN 21

Line 13, "represetative" should read --representative--.

COLUMN 22

Line 6, "decoded means" should read --decoding means--.
    Line 14, "according an" should read --according to an--.

Signed and Sealed this

Sixteenth Day of November, 1993

*Attest:*

BRUCE LEHMAN

*Attesting Officer*     Commissioner of Patents and Trademarks